United States Patent [19]

Hauer et al.

[11] Patent Number: 5,600,741
[45] Date of Patent: Feb. 4, 1997

[54] ARRANGEMENT FOR COUPLING OPTOELECTRONIC COMPONENTS AND OPTICAL WAVEGUIDES TO ONE ANOTHER

[75] Inventors: Heiner Hauer, Fellbach; Albrecht Kuke, Auenwald, both of Germany

[73] Assignee: ANT Nachrichtentechnik GmbH, Backnang, Germany

[21] Appl. No.: 432,243

[22] Filed: May 3, 1995

[30] Foreign Application Priority Data

May 11, 1994 [DE] Germany .................. 44 16 563.3

[51] Int. Cl.[6] ..................................... G02B 6/32
[52] U.S. Cl. ..................... 385/35; 385/14; 385/33; 385/49; 385/47; 385/51; 385/52; 385/88; 385/93
[58] Field of Search .................. 385/14, 31, 33, 385/34, 35, 36, 39, 47, 48, 49, 51, 88, 92, 93, 94, 52

[56] References Cited

U.S. PATENT DOCUMENTS

| 4,897,711 | 1/1990  | Blonder et al.   | 385/88 X |
| 4,919,506 | 4/1990  | Covey            | 385/33 X |
| 5,066,090 | 11/1991 | Mayerhofer et al.| 385/35   |
| 5,073,003 | 12/1991 | Clark            | 385/88 X |
| 5,093,879 | 3/1992  | Bregman et al.   | 385/93   |
| 5,357,590 | 10/1994 | Auracher         | 385/33   |
| 5,390,271 | 2/1995  | Priest           | 385/92   |
| 5,420,953 | 5/1995  | Boudreau et al.  | 385/88   |

FOREIGN PATENT DOCUMENTS

| 0331331 | 6/1989  | European Pat. Off. | 385/88 X |
| 0362767 | 11/1990 | European Pat. Off. | 385/88 X |
| 0421118 | 10/1991 | European Pat. Off. | 385/88 X |
| 3543558 | 11/1987 | Germany            | 385/88 X |
| 4140434 | 9/1993  | Germany            | 385/88 X |

*Primary Examiner*—Brian Healy
*Attorney, Agent, or Firm*—Michael J. Striker

[57] ABSTRACT

The arrangement for coupling optoelectronic components and optical waveguides to one another includes a carrier substrate (11); at least one optoelectronic component (9) or one optical waveguide (1) secured on the carrier substrate (11) and at least one lens (8) provided with an essentially planar surface and a spherical surface located opposite the essentially planar surface. The carrier substrate is provided with a depression (5) for a lens (8) having walls and the lens (8) is inserted into the depression (5) so that the lens (8) rests with its spherical surface contacting the walls of the depression (5) at at least 3 points and is rotatable about its spherical curvature center point. An adjustment device for rotatably positioning the lens (8) in the depression and a method of securing the lens in position after an adjustment are described.

20 Claims, 5 Drawing Sheets

ARRANGEMENT FOR COUPLING OPTOELECTRONIC COMPONENTS AND OPTICAL WAVEGUIDES TO ONE ANOTHER

BACKGROUND OF THE SPECIFICATION

The invention relates to an arrangement for coupling optoelectronic components and optical waveguides to one another using a carrier substrate, at least one optoelectronic component or one optical waveguide being secured on the carrier substrate and at least one lens being provided which has an essentially planar surface and a spherical surface located opposite the planar surface.

German Published Patent Application DE 35 43 558 A1 discloses an optoelectronic coupling arrangement in which light conducted through an optical waveguide is coupled to a photo-detector. Optical waveguide and photodetector are secured on a carrier substrate. The coupling is carried out via an optical deflection component. The depressions for mounting the optical components can be produced, for example, by anisotropic etching. If the light emerging from the optical waveguide has a large angular divergence, a low-loss coupling to the photodetector can be achieved by a lens. In the above-mentioned published patent application in the proposed arrangement a hemispherical lens is arranged between the optical waveguide and the photodiode. The planar surface of the hemispherical lens is constructed as a deflection element and the lens is simultaneously used for focusing.

For focusing the beam, it is also known to use Fresnel lenses or spherical lenses. The production of Fresnel lenses on a carrier substrate, for example a silicon surface, requires an increased expenditure with additional process steps. However, Fresnel lenses have the advantage of a flat structure. Spherical lenses can be inserted into anisotropically etched depressions which are produced during the micromechanical structuring, necessary anyway, of the carrier material. They have the disadvantage that either they project beyond the substrate surface or, in relation to the optically effective surface, they need very large depressions to accommodate them, as a result of which the assembly of the photodiode is impaired.

Whereas, in the case of an optical waveguide-photodiode coupling, because of the relatively large tolerances, a purely passive adjustment is possible using mounting structures made from anisotropically etched silicon, in the case of coupling an optical waveguide to a laser, a sufficiently high accuracy cannot be achieved by passive adjustment using the anisotropic etching technique. To achieve a coupling between laser and optical waveguide, at a high input coupling efficiency, an imaging optics unit is necessary because of the mode field diameters of different sizes. Adjustment between optical waveguide and laser should be possible.

SUMMARY OF THE INVENTION

It is the object of the invention to provide an arrangement for coupling optoelectronic components and optical waveguides to one another which is simply constructed and is adjustable.

The object is achieved by means of an arrangement for coupling optoelectronic components and optical waveguides to one another comprising a carrier substrate; at least two elements selected from the group consisting of optoelectronic components and optical waveguides to be coupled to each other and secured on the carrier substrate and at least one lens provided with an essentially planar surface and a spherical surface located opposite to the essentially planar surface and having a curvature center point. The carrier substrate is provided with a depression bounded by walls of the carrier substrate, one lens is inserted in the depression and the depression is formed so that the lens in the depression contacts the walls of the depression at points located on the spherical surface of the lens in the depression. The lens in the depression has means for directing a light beam passing through the lens by refraction.

Advantageously means for rotatably supporting the lens in the depression is provided so that the lens is rotatable in the depression. If the depression has suitably formed walls the spherical surface of the lens rests at three points on its surface on the walls and the lens is rotatable about the center of its spherical surface. A hemispherical lens is preferred.

The arrangement advantageously includes means for adjusting a position of the lens in the depression and means for fixing the lens in position after adjustment, which can be an adhesive.

In preferred embodiments of the invention the depression is an anisotropically etched cavity and one of the at least two elements is secured in an anisotropically etched cavity in the carrier substrate. Advantageously the essentially planar surface of the lens in the depression is inclined with respect to a surface of the carrier substrate so that, when a light beam passes through the lens in the depression, the light beam is deflected to one of the elements.

By using a lens having an essentially planar surface and having a spherical surface located opposite the latter, the arrangement according to the invention has the capability of simultaneously shaping and directing or aligning light beams. The lens described can, for example, be designed to be of spherical cap shape or hemispherical shape. A spherical or cylindrical curvature of the essentially planar surface, with a radius of curvature which is very large in relation to that of the spherical surface, is also acceptable (this is what is meant by an essentially planar surface). The lens is located with the spherical side in a depression, for example an anisotropically etched cavity, of the carrier substrate. In this depression, the lens is supported so as to be rotatable about the center point of the curvature of its spherical surface. It can be adjusted first and then fixed in position, e.g. by an adhesive. The lens described can be used in various applications: for example for focusing a light beam emerging from an optical waveguide into the active surface of a photodiode, or for the distribution of optical signal paths from a light-emitting board into a light-receiving board. The transmitting elements in the light-emitting board can either be semiconductor lasers or optical waveguides in this arrangement. The receiving elements in the optical light-receiving board can either be optical waveguides or receiving diodes in this arrangement. In this case, the lens has the ability to direct a light beam passing through it by refraction. An additional application is the coupling of semiconductor lasers and optical waveguides. An adjustability of the optical coupling device is advantageously provided by controlled tilting of the hemispherical lens relative to the substrate.

BRIEF DESCRIPTION OF THE DRAWING

The objects, features and advantages of the present invention will now be illustrated in more detail by the following detailed description, reference being made to the accompanying drawing in which.

DESCRIPTION OF THE PREFERRED EMBODIMENTS

Figure 1:
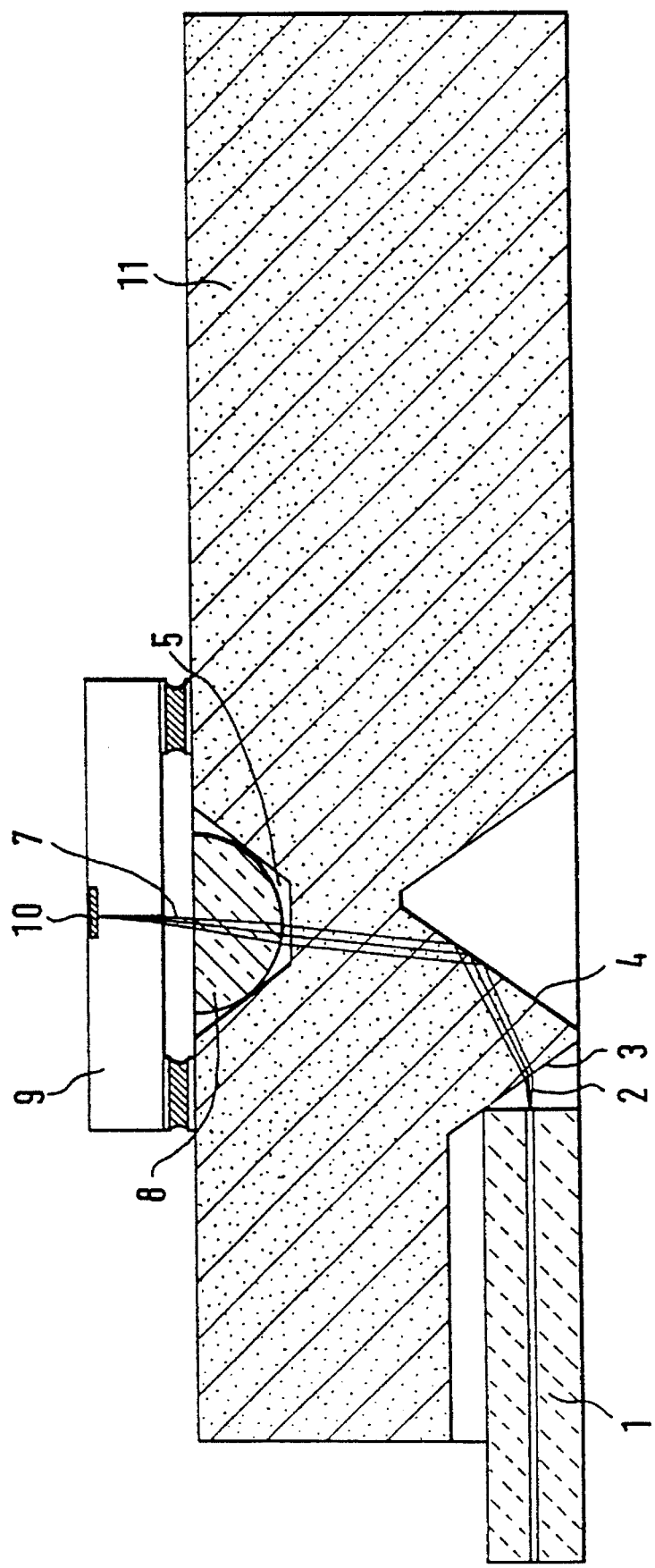
FIG. 1 is a cross-sectional view through a substrate on whose one side an optical waveguide is mounted and on whose other side a photodiode is fitted.

FIG. 1 shows an exemplary embodiment of the arrangement for coupling optoelectronic components and optical waveguides according to the invention. A Gaussian beam of light 2 emerging from a fiber 1 is deflected obliquely upwards at an angle of 6.8° to the wafer normal after refraction at an etched surface 4. On the substrate upper side, the beam is incident on an anisotropically etched cavity or depression 5 having a level base surface 6, into which a hemispherical lens 8 is inserted and fixed. The hemispherical lens focuses the light beam 2 into a photodiode 9. The light beam 2, which has been divergent until this point, is formed into a convergent beam of light 7 by the hemispherical lens 8. The hemispherical lens 8 has a radius and refractive index such that the image point of the convergent beam falls just in the active zone 10 of the photodiode 9. Since, in accordance with the arrangement in FIG. 1 for the imaging of the fiber core on the active surface of the photodiode, the image distance is smaller than the object distance, the diameter of the image spot is also smaller than the diameter of the fiber core. Even taking into account the aspheric distortion of the hemispherical lens, the spot diameter in the case of this imaging is smaller than 10 μm. Therefore, even in the case of very small-area photodiodes having an active surface of 30 μm, a lateral assembly tolerance of 10 μm in any direction is still permissible.

Figure 2:
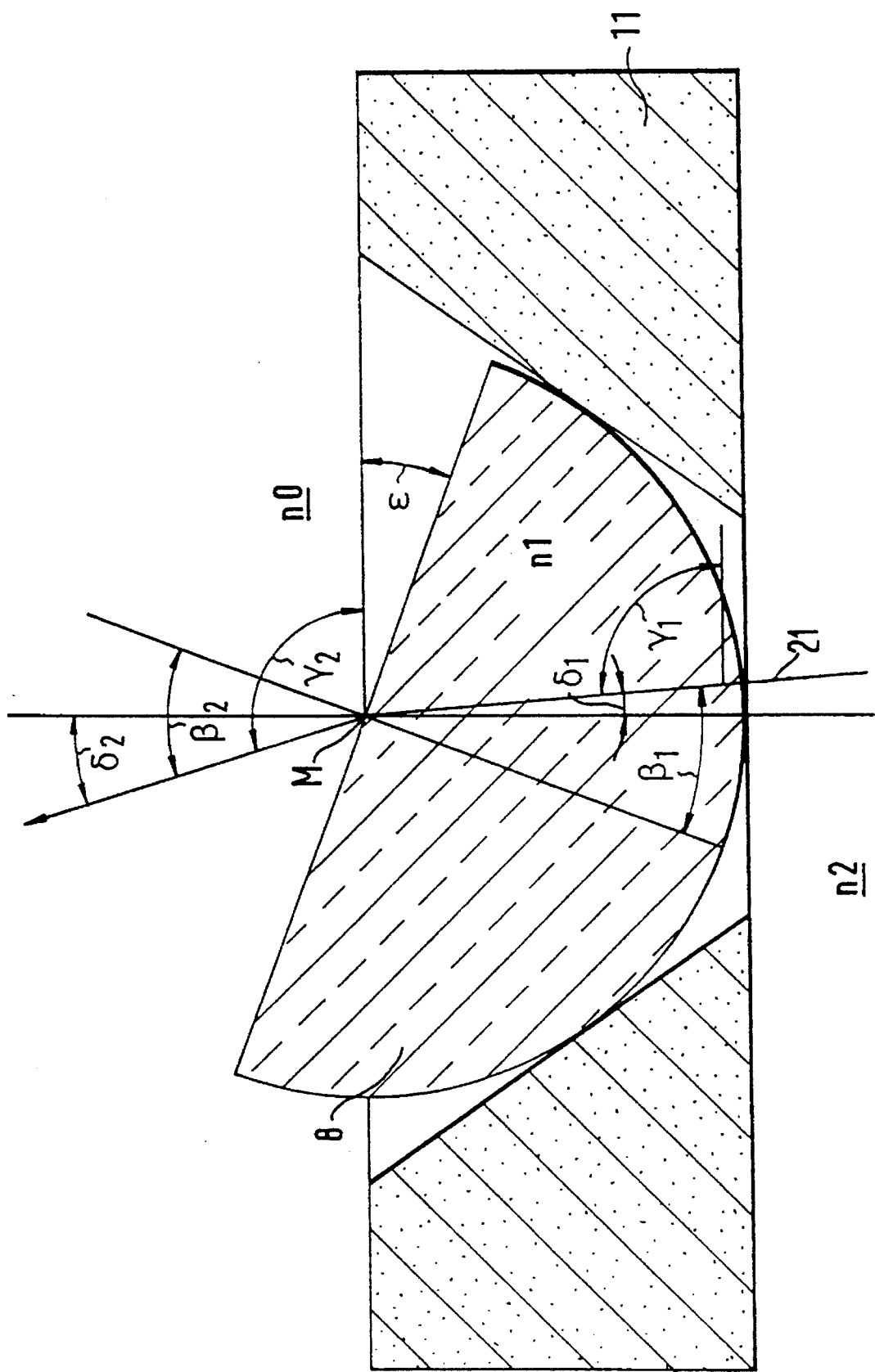
FIG. 2 is a detailed cross-sectional view showing the position of the lens in the depression with angles of inclination.

A further advantageous property of the hemispherical lens consists in the ability not only to focus or to collimate a divergent beam, but also to adjust it in its direction. The geometric considerations here are explained via FIG. 2. A light beam, represented by its central beam 21, is incident on the spherical side of a hemispherical lens 8. This central beam, according to the invention, is aligned so that it runs through the center point M of the hemispherical lens. The hemispherical lens 8 is supported in a depression 5 of a carrier plate 11, the spherical surface of the hemisphere resting on the side walls of the depression. By this type of support, the hemispherical lens can be tilted in two spatial directions, the center point M of the sphere remaining spatially fixed with respect to the carrier plate 11 and the incident light beam 21. The light refraction at the spherical surface of the hemispherical lens is therefore not altered during the tilting. If the beam diameter of the incident light beam is located on the focal surface of the hemispherical lens, the beam of light is then collimated within the hemispherical lens. The focal surface Bf is formed by a hemispherical shell, which has the radius r, around the center point M of the sphere. The focal radius $r_f$ for beams close to the center point is calculated to be $$r_f = n_1 * r/(n_1 - n_0) \quad (1)$$

where $n_1$ is the refractive index and r is the radius of the hemisphere and $n_0$ is the refractive index in external space.

If the lens is oriented in its tilted position in just such a way that the surface normal of its base plane is parallel to the central ray of the incident beam, the beam emerging from the lens is then not refracted. In the case of a tilting of the direction of the normal with respect to the incident central beam, an angular tilting of the emerging beam results from the light refraction, because of the Snellius law of refraction. In the process, a beam of light which is parallel in the lens interior remains parallel. In this way it is possible not only to produce a collimated beam but also to adjust it arbitrarily in terms of its beam direction in a two-dimensional angle range, within specific limits which are given by the refractive index of the hemispherical lens and the adjustment range of the lens mounting.

For calculation of the beam direction before and after passing through the hemispherical lens, the relationships given in the following text apply. Here, the variables within the hemispherical lens are designated by the subscript 1 and the variables in the external space adjacent to the base plane of the hemispherical lens are designated by the subscript 2. The variables in the external space which adjoins the spherical hemisphere side receive the subscript 0. The angles between the substrate plane and the beam direction are designated as direction angles τ. The angles between the normal to the base surface of the spherical lens and the beam direction are designated as angles of incidence β. The angle ε is the tilt angle of the lens, that is the angle between the surface normals of the substrate and the hemisphere base surface. The refractive indices are designated by n. The following relationships are obtained:

$$\beta_1 = \epsilon - \delta_1 \quad (2)$$

$$\beta_2 = \epsilon - \delta_2 \quad (3)$$

$$\sin \beta_2 / \sin \beta_1 = n_1/n_2 \quad (4)$$

$$\tau_1 = 90° + \delta_1 \quad (5)$$

$$\tau_2 = 90° + \delta_2 \quad (6)$$

$$\tau_1 = \tau_0 \quad (7)$$

By stipulating the tilt angle ε and a direction angle $\tau_2$ of an incident beam, the direction angle $\tau_0$ of the emergent beam can be calculated using equations (2–7) and vice versa. On the other hand, the necessary tilt angle ε can be calculated from the given direction angles $\tau_0$ and $\tau_2$. The equations specified here are derived, using FIG. 2, for a beam course in the drawing plane of FIG. 2. However, since incident and refracted beam always lie in one plane, the plane of incidence, which contains the surface normal of the base plane of the hemispherical lens and the incident and emergent beams, the above equations are true for any beam directions, even outside the plane of the drawing of FIG. 2, since in this general case a drawing plane can always be found which lies in the plane of incidence.

Apart from the ability to direct a light beam by refraction, the hemispherical lens can also direct the beam by reflection. To explain this, reference is made to FIG. 3, in which a particular application is shown. A semiconductor laser 50 is mounted on a carrier 11, preferably an anisotropically etched silicon substrate, the silicon substrate being used simultaneously as a very effective heat sink and as a carrier of the conductive track structure for driving and contacting the laser (not drawn here). A depression 5, into which a hemispherical lens is inserted, is an anisotropically etched cavity in the carrier or substrate 11 in front of the laser. The size and position of the depression determine the position of the center point M of the sphere whose spherical surface includes the spherical surface on the hemispherical lens and whose radius is equal to that of the hemispherical lens. The height of the center point of that sphere is selected such that it is located at the height of the active zone of the laser. Likewise, the position of the depression is selected so that M is located on the optical axis of the divergent beam of light 51 emerging from the laser. Here, differing from FIG. 2, the base plane of the hemispherical lens is inclined significantly more steeply with respect to the incident beam 51 and both the incident beam 51 and the emergent beam 52 penetrate the spherical side 81 of the hemispherical lens. According to the invention, when the angle between the normal of the base surface and the rays of the incident beam, taking into account the refraction of the edge rays of this beam, is greater than the limiting angle of total reflection, all the light is totally reflected at the base surface. When the angle of incidence on the base surface is smaller than the limiting angle of total reflection, the base surface, likewise according to the invention, can be silvered to produce reflection. The focal radius $r_f$ is reduced to one half, with respect to the calculation in accordance with equation 1, because of the twofold light refraction at the spherical surface.

For photonic applications for coupling numerous input and output signal paths, such as are needed, for example, in switching networks or in neural networks, the process according to the prior art is carried out such that a plurality of output paths are applied in a sub-switching plane and a plurality of sub-switching planes are then arranged one above the other so that a two-dimensional spatially staggered output element is present, in which there are n×m light outputs in an exit plane in a particular two-dimensional scanning grid. The divergent beams of radiation emerging from these light outputs are collimated in one planar structure mounted in front of the beams, for example via Fresnel lenses, and in a second planar structure located directly thereafter, for example by holograms, a two-dimensional deflecting structure converted into preselected directions and a provided focusing structure, which directs the light beam into the photodiodes of the respective receiving paths. The receiving paths are again arranged in sub-switching planes stacked onto one another, similarly to the transmitting paths. In this arrangement according to the prior art, it is disadvantageous that a very high geometric precision must be achieved in the arrangement of the sub-switching planes with respect to one another, of the imaging and deflecting planar structures with respect to one another and of these structures with respect to the input and output stacks of the sub-switching planes.

Figure 3:
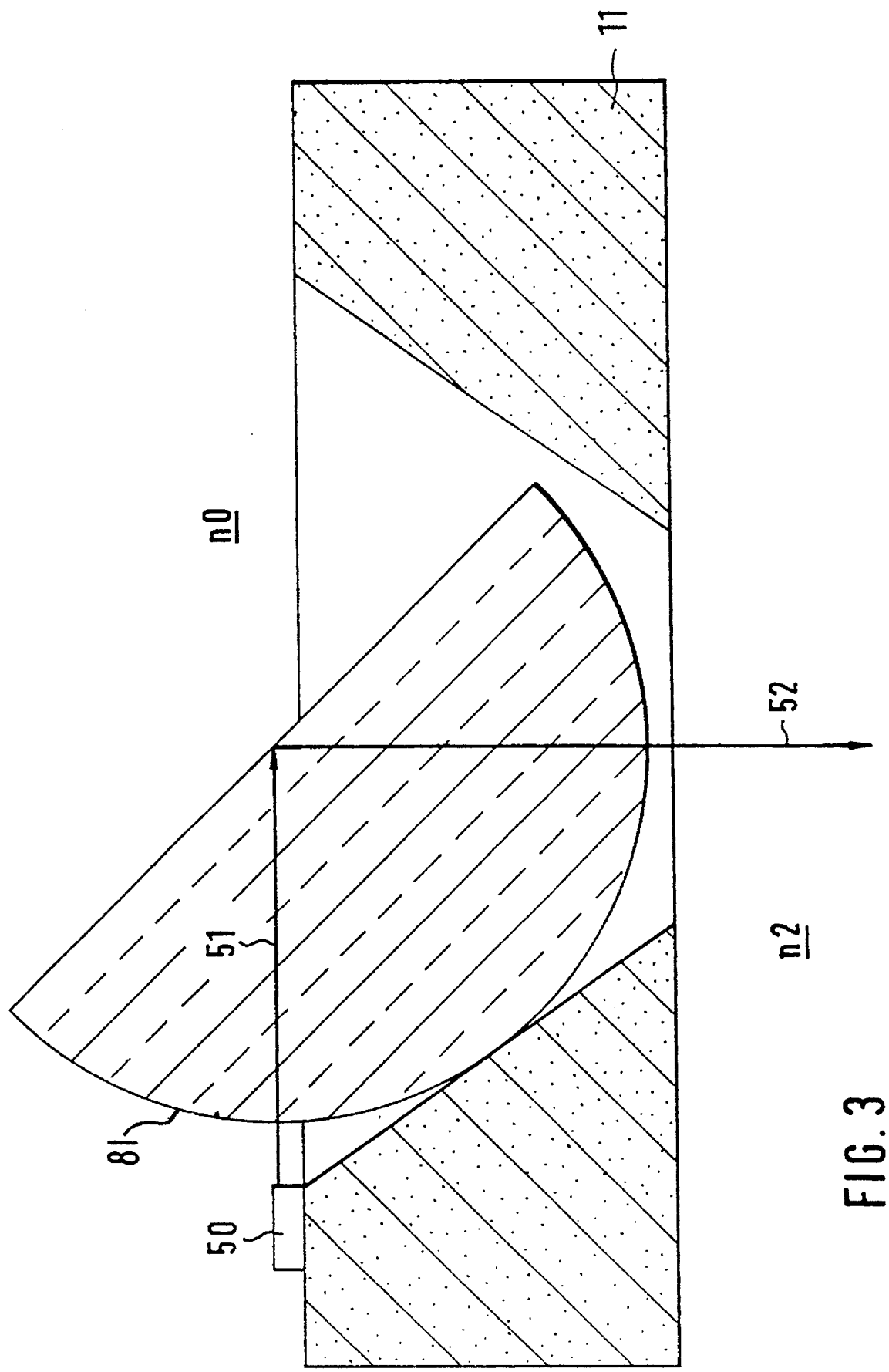
FIG. 3 is an additional detailed cross-sectional view showing an example of a position of the lens in a depression for reflecting light from a planar surface of the lens.
Figure 4:
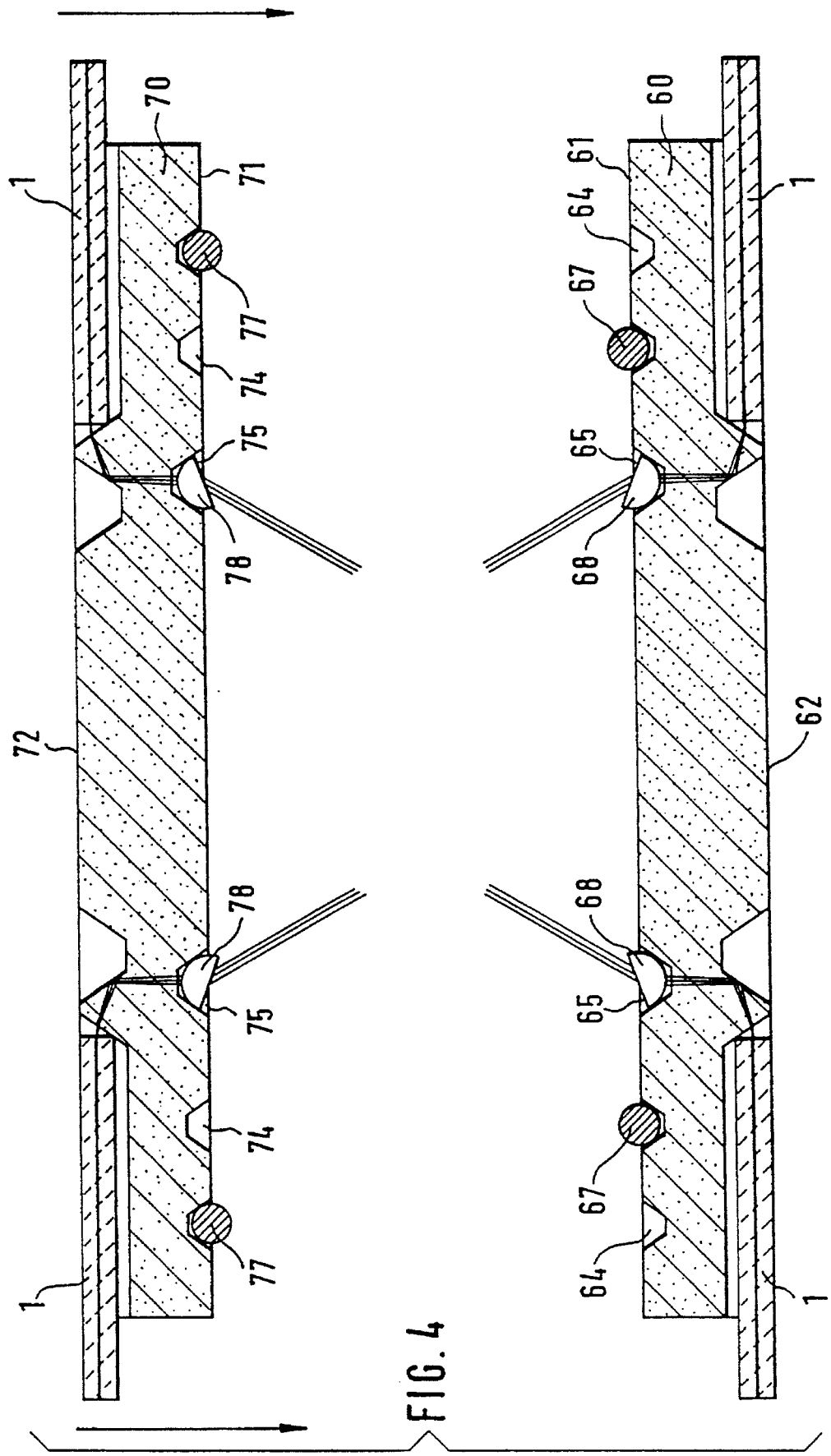
FIG. 4 is a cross-sectional view of an arrangement for distributing optical signal paths between a light-emitting board and a light-receiving board.

According to the invention, the beam-shaping and beam-directing tasks of the planar structures can be performed together by a hemispherical lenses. An exemplary embodiment for this according to the invention is shown in FIG. 4. A light-emitting board 60 contains, in a two-dimensional periodic arrangement on its upper side 61, a number of n×m hemispherical lenses 68, which are seated in depressions 65 and which are capable of collimating and directing the beam. On the underside 62, there are waveguides, whose beams of light, as described under application 1, are deflected by refraction and/or reflection approximately perpendicular to the substrate plane. By orienting the base surfaces of the hemispherical lenses, each of the n×m light beams can be individually directed. Instead of the waveguides, semiconductor lasers, as shown in FIG. 3, can also be mounted on the underside of the substrate, the light from these lasers being collimated and directed as described above. The receiving side is constructed in accordance with the transmitting side. A receiving board 70 contains on its underside a number of n×m hemispherical lenses 78 in depressions 75. These hemispherical lenses 78 direct the collimated beams of light directed onto them, by corresponding inclination of their base surfaces, perpendicular to the substrate plane and focus the light beams. Either optical waveguides or receiving diodes are mounted on the upper side 72. In relation to the arrangement according to the prior art, the specified solution according to the invention has the following advantages: The tasks of beam shaping and beam alignment are combined in one component, the hemispherical lens. Instead of 2×m sub-switching planes, only one transmitting and one receiving board are necessary.

It is not necessary for 2×m sub-switching planes and 4 beam shaping or beam deflecting planes to be adjusted with respect to one another, but rather only one receiving board with respect to one transmitting board. Adjustment of the two boards with respect to each other can be carried out purely passively in this arrangement by anisotropically etched depressions 64 and 74 and adjusting elements 67 inserted into these. If the adjustment depressions are produced in the same anisotropic etching process as the depressions 65 and 75, a high accuracy of the alignment is then achieved.

The alignment of the hemispherical lenses can be achieved together for all the lenses using a suitably formed adjusting device or gauge, which rests on the base surfaces of the lenses during the fixing process. For other path couplings, only another gauge must be used.

Whereas in the case of an optical waveguide-photodiode coupling, because of the relatively large tolerances (see also application 1 with lateral tolerances of 10 μm), a purely passive adjustment is possible using mounting structures made of anisotropically etched silicon, in the case of coupling an optical waveguide to a laser a sufficiently high accuracy cannot yet be achieved for a passive adjustment using the anisotropic etching technique or even using other methods in accordance with the prior art and even in the future can probably only be achieved with a very large expenditure, since the laser requires a positional accuracy in the sub-micrometer range because of its low mode field diameter of about 1 μm. To achieve a good coupling between laser and optical waveguide, an imaging optics unit is necessary because of the mode field diameters of different sizes. According to the prior art, at least in the sensitive directions perpendicular to the beam direction, an adjustment in the plane of the end face of the optical waveguide is necessary. Here, an active flange adjustment of the optical waveguide is normally carried out. Since the adjustment plane lies perpendicular to the beam direction, the planar construction of a module must be supplemented by a flange plane located perpendicular to the substrate plane, which means an additional assembly cost.

Figure 5:
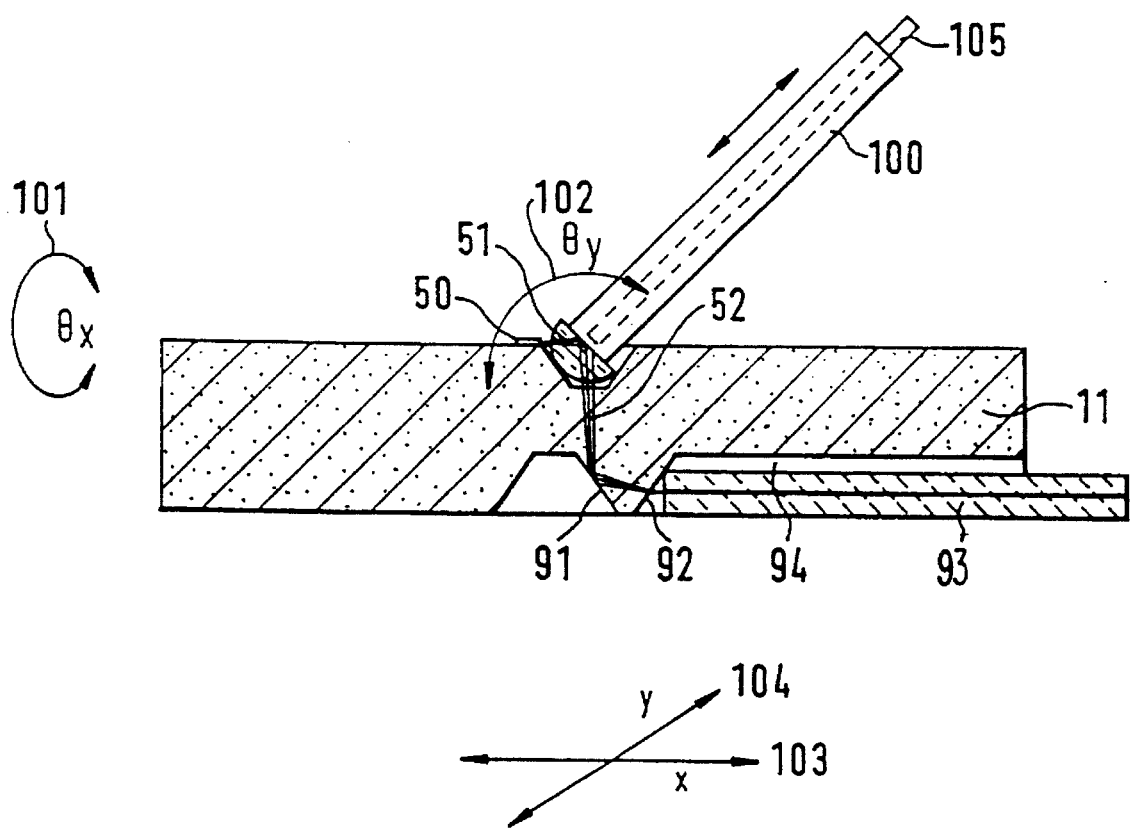
FIG. 5 is a cross-sectional view through another embodiment of the arrangement according to the invention comprising a device for coupling a laser and an optical waveguide.

The cost for assembly and adjustment can be significantly reduced by using an arrangement or adjusting device according to FIG. 5. A substrate 11 carries a semiconductor laser 50, mounted directly thereon. Etched in front of the semiconductor laser is a depression 5 which holds a hemispherical lens 8 which, in accordance with the embodiments of FIG. 3, has a large angle of inclination ε of about 45° with respect to the substrate surface. The beam 51, 52, shaped and directed by the hemispherical lens 8, is totally reflected and refracted, respectively, at the surfaces 91 and 92 and is incident on the end face of an optical waveguide 93. Apart from the surfaces 91 and 92, any other suitable beam deflection device can be used for beam deflection, with whose aid the beam can be deflected out of the virtually vertical direction into a virtually horizontal direction, for example a mirrored surface. The optical waveguide 93 can either be a fiber optic guide which is inserted into an anisotropically etched V-groove 94 or can be a strip light wave guide. By anisotropic structuring of the upper and lower side of the substrate, using markings 95 as positioning aids for the laser and a mounting 94 for the optical waveguide, and by means of the high accuracy of the beam deflecting surfaces 91 and 92 produced by anisotropic etching, a pre-positioning of these optical components results. However, as explained above, the accuracy is still not sufficient. For an adjustment according to the invention, the optical waveguide is not then moved, as is normally done in accordance with the prior art, until an optimum coupling is achieved but rather the optical waveguide remains in its fixed position, just as the laser remains fixed. Instead, according to the invention, the image, of the laser, generated by the hemispherical lens is adjusted via the end face of the optical waveguide until an optimum coupling has been achieved. For this purpose the angular orientation of the base surface of the hemispherical lens relative to the substrate is changed which, because of the reflection of the beam of light at the base surface, leads to a pivoting of the reflected beam 52 and thus to a movement of the image point on the end face of the optical waveguide. Since the incident beam 51 is directed onto the center point M of the sphere, only the beam direction changes during the adjustment, but not the imaging properties of the lens.

Instead of tilting the hemispherical lens with respect to a stationary substrate, the lens can also be held stationary and the substrate tilted for this purpose. In FIG. 5, an adjustment device according to the invention is shown. The substrate 11 is seated on a goniometer table 101, 102 which can be pivoted in the angles $\theta_x$ and $\theta_y$ and whose axes of rotation $R_x$ and $R_y$ intersect at right angles at a point $M_R$. An XY-table 103, 104 placed on the goniometer table moves the substrate before the adjustment in such a manner that the center point M of the sphere of the hemispherical lens 8 falls in the center point $M_R$ of the rotation. Before the adjustment, the goniometer table is brought into the horizontal position and the hemispherical lens is held using a tube 100, for example by vacuum suction, and pressed with a gentle force into the depression 5, the tube being oriented at an angle of approximately 45° to the wafer normal. For the subsequent fixing, an adhesive, preferably an adhesive which can be hardened using UV light, can be used, which can already be introduced into the depression 5 before the fixing. The adhesive can also entirely occupy the space underneath the lens between lens and carrier material, preferably silicon. To calculate the lens refractive power (see equation 1), the refractive index of the adhesive must then accordingly be used. By tilting the goniometer table in a two-dimensional angle range, the beam can now be pivoted to achieve an optimum coupling efficiency. Using normal goniometer tables, an angular resolution of 0.001° can be achieved. In the case of a light path s corresponding to the substrate thickness of 500 μm, a pivoting angle Δε of 0.001° results in a deflection of the image point Δx of $$\Delta x = 2 \cdot s \cdot \tan(\Delta\epsilon) = 0.017 \text{ μm}. \quad (8)$$

This adjustment is therefore at least as accurate as conventional lateral displacement tables having an accuracy of typically 0.1 μm. Since the hemispherical lens during the adjustment always rests with its spherical surface on the side surfaces of the depression 5, no deadjustment is to be expected during the subsequent fixing. Adhesive friction, which can easily lead to a disturbing jerky movement during adjusting in the case of the conventional flange method, is not to be feared here, since the adhesive is liquid during the adjustment and a fluid friction free of adhesive friction is therefore present.

A further advantage of the adjustment method according to the invention is that the adhesive is not located between metallic flange surfaces but between the optically transparent hemispherical lens and the silicon. For this reason, above all, only an adhesive which can be hardened using light can be used. The UV light necessary for hardening is beamed through the lens onto the adhesive. An optical waveguide 105 for UV light can preferably be simultaneously guided in the tube 100 which is used for holding the lens fast. After achieving the optimum adjustment position, the UV light is directed, via the optical waveguide located in the tube, through the base surface of the hemispherical lens, which is transparent to the beams 51, 52 in the case of perpendicular incidence, in contrast with its total reflection, through to the adhesive locations on the spherical side of the hemispherical lens.

To automate the adjustment and fixing process, even for modules having a plurality of lasers on one substrate, the tube 100 can pick up the hemispherical lenses from a storage container by vacuum suction, and, in conjunction with an axial movement device for the tube and with the X-Y tables 103, 104, place them in the corresponding depressions 5.

Normally, semiconductor lasers have no circular symmetrical mode field like optical fibers, but an elliptical mode field. In particular, the high power lasers which are used for the pumping of optical fiber amplifiers have an elliptical near field with an axis ratio of about 3:1. With the image in the circular-symmetrical field of a fiber, an optimum coupling cannot be achieved using a circular-symmetrical lens. This optimum coupling would, however, be of extraordinary importance just in this application. Recent proposals for solving this problem provide a cylindrical lens which is placed transversely in front of a circular-symmetrical lens. Even if an improved coupling efficiency can be achieved by this method, this method has the disadvantage that the additional optical component must be adjusted.

By a slight modification of the hemispherical lens, this problem can also be solved in a simple way. For this purpose, the previously flat base surface of the hemispherical lens is cylindrically machined. This can either be carried out by grinding and polishing the base surface cylindrically or by pressing the base surface via a suitably shaped die during heating above the softening temperature. This pressing method is used at present in the production of aspherical lenses. By suitable shaping of the pressing tool, the base surface can also be shaped such that, apart from the cylindrical component for matching an elliptical mode field to a circular-symmetrical mode field, an aspherical component for reducing or preventing the spherical distortions through the sphere surfaces can additionally be achieved. Likewise, an additional beam correction or an effect on the beam can be achieved by applying a Fresnel structure to the base surface of the lens. The shaping of the base surface has no influence on the adjustment and beam deflection properties according to the invention, which are based on the spherical supporting of the lens 8 on the side surfaces of the depression 5.

We claim:

1. An arrangement for coupling optoelectronic components and optical waveguides to one another, said arrangement comprising a carrier substrate (11); at least two elements selected from the group consisting of optoelectronic components (9) and optical waveguides (1) to be coupled to each other, said at least two elements being secured on the carrier substrate (11); and at least one lens (8) provided with an essentially planar surface and a spherical surface located opposite to said essentially planar surface, said spherical surface having a curvature center point; wherein the carrier substrate (11) is provided with a depression (5) bounded by walls of said carrier substrate (11), one of the at least one lens (8) is inserted in the depression (5) and the depression (5) is formed so that said lens in said depression contacts the walls of the depression (5) at points located on the spherical surface of said lens in said depression (5) and said lens contacting said walls is supported so as to be rotatable about the curvature center point of the spherical surface.

2. The arrangement as defined in claim 1, further comprising means for adjusting a position of said lens (8) in said depression (5) and means for fixing said lens (8) in said position in said depression (5) after an adjustment is performed by said means for adjusting, and wherein said means for fixing said lens (8) in said position includes a portion of an adhesive.

3. The arrangement as defined in claim 1, wherein said depression (5) is an anisotropically etched cavity.

4. The arrangement as defined in claim 1, wherein at least one of said at least two elements is secured in an anisotropically etched cavity in the carrier substrate (11).

5. The arrangement as defined in claim 1, wherein the essentially planar surface of the lens (8) in the depression (5) is inclined with respect to a surface of the carrier substrate (11) so that, when a light beam passes through said lens (8) in said depression (5), the light beam is deflected to one of said at least two elements.

6. The arrangement as defined in claim 1, wherein the lens (8) in the depression (5) has a hemispherical shape.

7. An arrangement for coupling optoelectronic components and optical waveguides to one another, said arrangement comprising a carrier substrate (11); at least two elements selected from the group consisting of optoelectronic components (9) and optical waveguides (1) to be coupled to each other, said at least two elements being secured on the carrier substrate (11); at least one lens (8) provided with an essentially planar surface and a spherical surface located opposite to said essentially planar surface, said spherical surface having a curvature center point, wherein the carrier substrate (11) is provided with a depression (5) bounded by walls of said carrier substrate (11), one of the at least one lens (8) is inserted in the depression (5) and the depression (5) is formed so that said lens (8) in said depression (5) contacts the walls of the depression (5) at points located on the spherical surface of said lens in said depression (5) and said lens in said depression (5) includes means for directing a light beam passing through said lens in said depression by refraction; and means for rotatably supporting said lens (8) in the depression (5) so that said lens is rotatable in said depression (5).

8. The arrangement as defined in claim 7, further comprising means for adjusting a position of said lens (8) in said depression (5) and means for fixing said lens (8) in said position in said depression (5) after an adjustment is performed by said means for adjusting, said means for fixing said lens (8) in said position including a portion of an adhesive.

9. The arrangement as defined in claim 7, wherein said depression (5) is an anisotropically etched cavity.

10. The arrangement as defined in claim 7, wherein at least one of said at least two elements is secured in an anisotropically etched cavity in the carrier substrate (11).

11. The arrangement as defined in claim 7, wherein the essentially planar surface of the lens (8) in the depression (5) is inclined with respect to a surface of the carrier substrate (11) so that, when a light beam passes through said lens (8) in said depression (5), the light beam is deflected to one of said at least two elements.

12. The arrangement as defined in claim 7, wherein the lens (8) in the depression (5) has a hemispherical shape.

13. An arrangement for coupling optoelectronic components and optical waveguides to one another, said arrangement comprising a carrier substrate (11); a plurality of elements selected from the group consisting of optoelectronic components (9) and optical waveguides (1) to be coupled to each other so that a light beam is passed between at least two of the elements, each of said elements being secured on the carrier substrate (11); and a lens (8) provided with an essentially planar surface and a spherical surface located opposite to said essentially planar surface so as to be able to direct said light beam when said light beam passes through said lens (8) by refraction, said spherical surface having a curvature center point;

wherein the carrier substrate (11) is provided with a depression (5) bounded by walls of said carrier substrate (11), said lens (8) is inserted in said depression (5), said depression is formed so that the lens (8) contacts the walls of the depression (5) at points located on the spherical surface of said lens (8), said lens (8) is supported in the depression (5) so as to be rotatable about the curvature center point of the spherical surface and said lens (8) and said depression (5) are positioned in said carrier substrate (11) so that said lens (8) receives said light beam from one of said elements and directs said light beam to another of said elements.

14. The arrangement as defined in claim 13, further comprising at least one other lens (8) for coupling two others of said elements, said at least one other lens (8) provided with an essentially planar surface and a spherical surface with a curvature center point located opposite to said essentially planar surface so as to be able to direct said light beam when said light beam passes through said at least one other lens; wherein the carrier substrate (11) is provided with at least one other depression (5) bounded by other walls of said carrier substrate (11), said at least one other depressions (5) accommodating the at least one other lens (8) and being formed so that the at least one other lens (8) held therein contacts the other walls at points located on the spherical surface of said at least one other lens (8) held therein and said at least one other lens (8) is supported in said carrier substrate (11) so as to be rotatable about the curvature center point.

15. The arrangement as defined in claim 14, wherein said at least one other lens (8) has a hemispherical shape.

16. An arrangement for coupling optoelectronic components and optical waveguides to one another, said arrangement comprising a carrier substrate (11) having walls and provided with a depression (5) bounded by said walls;

at least two elements selected from the group consisting of optoelectronic components (9) and optical waveguides (1) to be coupled to each other, said at least two elements being secured on the carrier substrate (11);

at least one lens (8) provided with an essentially planar surface and a spherical surface located opposite to said essentially planar surface, said spherical surface having a curvature center point, wherein one of the at least one lens (8) is inserted in the depression (5) and the depression (5) is formed so that said lens (8) in the depression contacts the walls of the depression (5) at points located on the spherical surface of said lens in said depression (5) and said lens in said depression (5) includes means for directing a light beam passing through said lens in said depression by refraction; and means for fixing said lens (8) in a position in said depression (5) after an adjustment is performed by means for adjusting lens position, wherein said means for fixing said lens (8) in said position is a portion of an adhesive.

17. The arrangement as defined in claim 16, wherein said depression (5) is an anisotropically etched cavity.

18. The arrangement as defined in claim 16, wherein at least one of said at least two elements is secured in an anisotropically etched cavity in the carrier substrate (11).

19. The arrangement as defined in claim 16, wherein the lens (8) in the depression (5) has a hemispherical shape.

20. The arrangement as defined in claim 16, wherein said at least two elements comprise a semiconductor laser and one of said optical wave guides coupled to each other by said lens in said depression.

* * * * *